United States Patent
Lim et al.

(10) Patent No.: US 12,322,463 B2
(45) Date of Patent: Jun. 3, 2025

(54) VEHICLE MEMORY SYSTEM BASED ON 3D MEMORY AND METHOD OPERATING THEREOF

(71) Applicants: Hyundai Motor Company, Seoul (KR); Kia Corporation, Seoul (KR); Hyundai Autoever Corp., Seoul (KR)

(72) Inventors: Hong Yeol Lim, Incheon (KR); Myung Hyun Koo, Seoul (KR)

(73) Assignees: Hyundai Motor Company, Seoul (KR); Kia Corporation, Seoul (KR); Hyundai AutoEver Corp., Seoul (KR)

(*) Notice: Subject to any disclaimer, the term of this patent is extended or adjusted under 35 U.S.C. 154(b) by 707 days.

(21) Appl. No.: 17/411,547

(22) Filed: Aug. 25, 2021

(65) Prior Publication Data

US 2022/0293202 A1    Sep. 15, 2022

(30) Foreign Application Priority Data

Mar. 11, 2021   (KR) ................. 10-2021-0032228

(51) Int. Cl.
| | |
|---|---|
| G11C 29/00 | (2006.01) |
| G11C 11/409 | (2006.01) |
| G11C 29/02 | (2006.01) |
| G11C 29/42 | (2006.01) |
| G11C 29/44 | (2006.01) |
| G11C 29/04 | (2006.01) |

(52) U.S. Cl.
CPC .......... *G11C 29/022* (2013.01); *G11C 11/409* (2013.01); *G11C 29/42* (2013.01); *G11C 29/4401* (2013.01); *G11C 2029/0401* (2013.01); *G11C 2207/104* (2013.01)

(58) Field of Classification Search
CPC ... G11C 7/1087; G11C 16/0483; G11C 16/08; G11C 16/102; G11C 16/26; G11C 16/32; G11C 16/3481; G11C 2029/0411; G11C 16/10
See application file for complete search history.

(56) References Cited

U.S. PATENT DOCUMENTS

| | | | |
|---|---|---|---|
| 8,922,243 B2 | 12/2014 | Jayasena et al. | |
| 10,291,397 B2 | 5/2019 | McElheny et al. | |
| 10,373,654 B1* | 8/2019 | Vankayala | .......... H01L 25/0657 |
| 11,855,061 B2* | 12/2023 | Wilkerson | .............. H01L 24/09 |
| 2010/0008058 A1* | 1/2010 | Saen | ...................... H01L 23/481 |
| | | | 361/803 |
| 2013/0082404 A1* | 4/2013 | Kajigaya | .............. G11C 7/1006 |
| | | | 257/777 |
| 2019/0051642 A1* | 2/2019 | Gupta Hyde | ......... G06F 1/3296 |

(Continued)

*Primary Examiner* — Mushfique Siddique
(74) *Attorney, Agent, or Firm* — Fox Rothschild LLP

(57) ABSTRACT

A vehicle memory system and a driving method thereof are provided. The vehicle memory system includes a first function device that is configured to perform a safety function of a vehicle and a second function device that is configured to perform a convenience specification function of the vehicle. A first memory layer is shared by the first function device and the second function device and a second memory layer is used solely by the second function device. A vehicle memory device has a stacked structure including a through-silicon electrode connecting the first function device, the first memory layer, the second function device, and the second memory layer.

11 Claims, 4 Drawing Sheets

(56) References Cited

U.S. PATENT DOCUMENTS

| | | | |
|---|---|---|---|
| 2020/0192831 A1* | 6/2020 | Lim .................... | G06F 13/1663 |
| 2020/0303344 A1* | 9/2020 | Manipatruni .......... | H10B 10/00 |
| 2022/0139426 A1* | 5/2022 | Keeth .................... | G11C 5/063 |
| | | | 365/244 |
| 2022/0319569 A1* | 10/2022 | Veches ................... | G11C 5/063 |

* cited by examiner

VEHICLE MEMORY SYSTEM BASED ON 3D MEMORY AND METHOD OPERATING THEREOF

CROSS-REFERENCE TO RELATED APPLICATION

This application claims priority to and benefits of Korean Patent Application No. 10-2021-0032228 filed on Mar. 11, 2021, the entire contents of which are incorporated herein by reference.

BACKGROUND

(a) Field of the Disclosure

The present disclosure relates to a vehicle memory system based on a 3D memory and a driving method thereof, and more particularly, to a technique in which a 3D memory structure is combined with a vehicle controller.

(b) Description of the Related Art

A semiconductor device includes a memory device capable of storing data, and the memory device is divided into a volatile memory device such as DRAM and a nonvolatile memory device such as a NAND flash. Such a memory device may include memory cells. The memory cells may be arranged in three dimensions. For these memory cells, An in-vehicle memory is essential as various electronic devices for vehicle safety increase. Accordingly, it is necessary to develop a technique for applying a memory cell having a 3D structure to a vehicle.

The above information disclosed in this section is merely for enhancement of understanding of the background of the disclosure, and therefore, it may contain information that does not form the prior art that is already known in this country to a person of ordinary skill in the art.

SUMMARY

The present disclosure provides a vehicle memory system, and a driving method thereof, capable of securing stability of data processing by a vehicle controller by applying a three-dimensional (3D) memory-based fail-safe isolation (FSI) architecture to a vehicle controller.

The technical objects of the present disclosure are not limited to the objects mentioned above, and other technical objects not mentioned can be clearly understood by those skilled in the art from the description of the claims.

An exemplary embodiment of the present disclosure provides a vehicle memory system that may include: a first function device configured to perform a safety function of a vehicle; a second function device configured to perform a convenience specification function of the vehicle; a first memory layer that is shared by the first function device and the second function device; a second memory layer that is used solely by the second function device; and a vehicle memory device configured to have a stacked structure including a through-silicon electrode connecting the first function device, the first memory layer, the second function device, and the second memory layer.

In an exemplary embodiment, the first function device, the first memory layer, the second function device, and the second memory layer may be sequentially stacked. The through-silicon electrode may include a reading path and a writing path separately. The first memory layer may include: a first sublayer configured to enable reading and writing access by the first function device and reading access by the second function device; and a second sublayer configured to enable reading and writing access by the second function device and reading access by the first function device, and it may have a structure in which the first sublayer and the second sublayer are stacked.

The second memory layer may include: a first sublayer and a second sublayer which are inaccessible by the first function device, enable reading and writing access by the second function device and reading access by the first function device, and are stacked on top of each other. In an exemplary embodiment, it may further include: a vehicle memory control apparatus configured to monitor whether the vehicle memory apparatus fails. The vehicle memory control apparatus, when the first function device fails, may be configured to operate the first function device to not access the first memory layer, and perform recovery processing of the first function device.

In an exemplary embodiment, the vehicle memory control apparatus may be configured to shut down the entire system when recovery of the first function device is failed. In addition, the vehicle memory control apparatus, when the second function device fails, may be configured to operate the second function device to not access the first memory layer and the second memory layer, and perform recovery processing of the second function device. In addition, the vehicle memory control apparatus may be configured to drive only the first function device or shut down the entire system when recovery of the second function device is failed.

In an exemplary embodiment, the vehicle memory control apparatus, when the through-silicon electrode fails, may be configured to block a reading path and a writing path of the through-silicon electrode in which a failure has occurred, and control another through-silicon electrode to be used. The vehicle memory control apparatus may be configured to independently apply power to the first function device and the second function device.

An exemplary embodiment of the present disclosure provides a vehicle memory driving method that may include when a vehicle memory apparatus in which a first function device configured to perform a safety function of a vehicle; a first memory layer; a second function device configured to perform a convenience specification function of the vehicle; and a second memory layer are stacked is driven, sharing and driving the first memory layer by the first function device and the second function device; and independently drive the second memory layer by the second function device.

In an exemplary embodiment, the method may further include: monitoring whether the first function device and the second function device fail. When the first function device fails, the first functional device may be operated to not access the first memory layer. In addition the method may further include: performing recovery processing by reapplying power to the first functional device.

The method may further include: shutting down the entire system when recovery of the first function device is failed. When the second function device fails, the second functional device may be operated to not access the first memory layer and the second memory layer. Additionally, the method may include: performing recovery processing by reapplying power to the second functional device and driving only the first function device or shut down the entire system when recovery of the second function device is failed.

According to the present technique, it is possible to secure stability of data processing by a vehicle controller by applying a 3D memory-based fail-safe isolation (FSI) architecture to a vehicle controller. In addition, various effects that can be directly or indirectly identified through this document may be provided.

BRIEF DESCRIPTION OF THE DRAWINGS

The above and other features of the present disclosure will now be described in detail with reference to exemplary embodiments thereof illustrated in the accompanying drawings which are given herein below by way of illustration only, and thus are not limitative of the present invention, and wherein.

DETAILED DESCRIPTION

Figure 1:
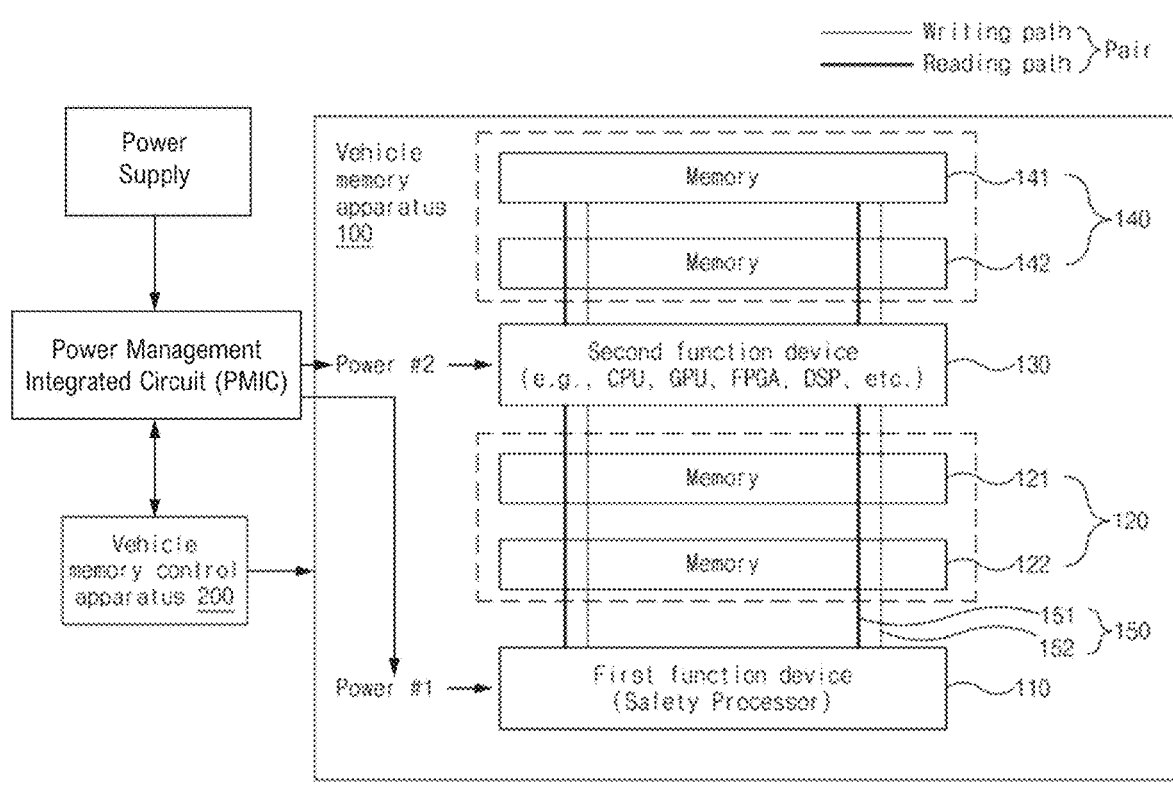
FIG. 1 illustrates schematic diagram showing a vehicle memory system according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Furthermore, control logic of the present disclosure may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, some exemplary embodiments of the present disclosure will be described in detail with reference to exemplary drawings. It should be noted that in adding reference numerals to constituent elements of each drawing, the same constituent elements have the same reference numerals as possible even though they are indicated on different drawings. In addition, in describing exemplary embodiments of the present disclosure, when it is determined that detailed descriptions of related well-known configurations or functions interfere with understanding of the exemplary embodiments of the present disclosure, the detailed descriptions thereof will be omitted.

In describing constituent elements according to an exemplary embodiment of the present disclosure, terms such as first, second, A, B, (a), and (b) may be used. These terms are only for distinguishing the constituent elements from other constituent elements, and the nature, sequences, or orders of the constituent elements are not limited by the terms. In addition, all terms used herein including technical scientific terms have the same meanings as those which are generally understood by those skilled in the technical field to which the present disclosure pertains (those skilled in the art) unless they are differently defined. Terms defined in a generally used dictionary shall be construed to have meanings matching those in the context of a related art, and shall not be construed to have idealized or excessively formal meanings unless they are clearly defined in the present specification.

The present disclosure relates to a vehicle memory system based on a 3D memory, and discloses a memory structure thereof and a fail-safe method. Hereinafter, exemplary embodiments of the present disclosure will be described in detail with reference to FIG. 1 to FIG. 4. FIG. 1 illustrates schematic diagram showing a vehicle memory system according to an exemplary embodiment of the present disclosure. Referring to FIG. 1, the vehicle system according to the exemplary embodiment of the present disclosure may include a vehicle memory apparatus 100 and a vehicle memory control apparatus 200.

The vehicle memory apparatus 100 and the vehicle memory control apparatus 200 according to the exemplary embodiment of the present disclosure may be implemented inside the vehicle. In particular, the vehicle memory apparatus 100 and the vehicle memory control apparatus 200 may be integrally formed with internal control units of the vehicle, or may be implemented as a separate device to be connected to control units of the vehicle by a separate connection. Referring to FIG. 1, in the vehicle memory device 100, a first function device 110, a first memory layer 120, a second function device 130, and a second memory layer 140 are sequentially stacked, and it may include a through-silicon electrode 150 connecting each component. In other words, the vehicle memory apparatus 100 may have a 3D stacked memory structure.

The first function device 110 and the second function device 130 may be electric circuits that execute software commands to perform various data processing and calculations. Separate power lines Power #1 and Power #2 are connected to the first function device 110 and the second function device 130, respectively, to independently apply power. The first function device 110 may be configured to perform a safety function of a vehicle, e.g., an autonomous driving control function, a forward collision-avoidance assist (FCA) function, and the like, and may be an electronic control unit (ECU), a micro controller unit (MCU) or other subcontroller mounted in a vehicle.

The second function device 130 may be configured to perform a vehicle convenience specification function, and recognition determination, deep learning, etc., and may be a controller such as a central processing unit (CPU), a graphic processing Unit (GPU), a field programmable gate array (FPGA), a digital signal processor (DSP), or the like. The first and second memory layers 120 and 140 may include a DRAM or a NAND flash. The first memory layer 120 may be divided into two sublayers 121 and 122 of a stacked structure. Similarly, the second memory layer 140 may be divided into two sublayers 141 and 142 of a stacked structure. In particular, each of the sublayers 121 and 122, and the sublayers 141 and 142 may be stacked.

The first memory layer 120 may be driven as a shared memory of the first function device 110 and the second function device 130, and the second memory layer 140 may be driven as a dedicated memory to the second function device 130. In other words, the first function device 110 may be configured to transmit and receive data by using only the first memory layer 120, and the second function device 130 may be configured to transmit and receive data by using both the first memory layer 120 and the second memory layer 140.

An operating range and detailed functions of the memory device are shown in Table 1.

TABLE 1

| Memory device | Operating range | Detailed function |
|---|---|---|
| First memory layer (Sublayer 1-1) | Controller/accelerator sharing | First function: READ & WRITE<br>Second function device: READ only |
| First memory layer (Sublayer 1-2) | Controller/accelerator sharing | First function: READ only<br>Second function device: READ & WRITE |
| Second memory layer | Accelerator only | First function device: not Access<br>Second function device: READ & WRITE |

As shown in Table 1, the first sublayer 121 of the first memory layer 120 is capable of reading and writing operations of the first function device 110, and only a read operation of the second function device 130 is performed.

The second sublayer 122 of the first memory layer 120 may be configured to perform only the read operation of the first function device 110 and both reading and writing operations of the second function device 130. The first sublayer 141 and the second sublayer 142 of the second memory layer 140 are both inaccessible to the first function device 110, and perform both reading and writing operations of the second function device 130.

Accordingly, according to the present disclosure, data contamination between the first function device 110 and the second function device 130 may be prevented by setting data access rights of the first function device 110 and the second function device 130 differently for each memory layer. In particular, a circuit for driving a chip such as power lines Power #1 and Power #2 may be separately provided, and power may be respectively applied to the first function device 110 and the second function device 130 through an external power management integrated circuit (PMIC) or the like.

In addition, the vehicle memory apparatus 100 may include a plurality of through-silicon electrodes 150 for extending the first function device 110, the first memory layer 120, the second function device 130, and the second memory layer 140 to connect them. The through-silicon electrodes 150 may be divided into a reading path 151 and a writing path 152 for reading or writing the memory layers. In particular, one reading path 151 and one writing path 152 may be configured as a pair. When an error occurs in the reading path 151 and the writing path 152, the vehicle memory apparatus 100 may be configured to block a path of corresponding through-silicon electrodes 150, and use a path of other through-silicon electrodes.

The vehicle memory control apparatus 200 may be configured to determine a normal operation or a failure situation of the vehicle memory apparatus 100, and be configured to execute an operation of the vehicle memory apparatus 100 for each situation. The vehicle memory control apparatus 200 may be implemented as a separate watch dog, etc., and may be configured to determine whether the first function device 110, the second function device 130, and the through-silicon electrodes 150 fail. For example, the vehicle memory control apparatus 200 may include a case where a signal is not received from a hardware of the first function device 110 or the second function device 130 or a software is not driven depending on a predetermined schedule. In particular, for the failure situation, not only the vehicle memory control apparatus 200, but also the first function device 110, the second function device 130, and the through-silicon electrode 150 may recognize their own failure.

First, during normal operation, the first function device 110 may be configured to perform a data reading or writing operation using the first memory layer 120, and the second function unit 130 may be configured to perform a data reading or writing operation using the first memory layer 120 and second memory layer 140. However, when the second function device 130 fails, the vehicle memory control apparatus 200 may be configured to operate the second function device 130 to not access to the first memory layer 120 and the second memory layer 140, and may be configured to operate only the first functional device 110 to perform a data reading or writing operation by using the first memory layer 120. Particularly, the vehicle memory control apparatus 200 may enable failure recovery processing to be performed by reapplying power to the second function device 130, and when the second function device 130 fails to recover, may be configured to allow only the first functional device 110 to use the first memory layer 120 alone or shut down the entire system. The failure recovery processing may include an operation of resetting a software of the second function device 130 or turning on or off a hardware. The second function device 130 may be configured to perform the failure recovery processing based on a command of the vehicle memory control apparatus 200, and may be configured to autonomously perform the failure recovery processing when a failure occurs.

In addition, in response to determining that a failure condition of the first function device 110 occurs, the vehicle memory control apparatus 200 may be configured to operate the first function device 110 to not access the first memory layer 120, and operate only the second function device 130 to access the first memory layer 120 and the second memory layer 140 to perform a data reading or writing operation. In particular, the vehicle memory control apparatus 200 may be configured to reapply power to the first function unit 110 to perform the failure recovery processing, and when the first function device 110 fails, may be configured to shut down the entire system. In other words, since the first function device 110 performs a function directly related to the safety of the vehicle, the system may be shut down for safety without performing the operation of the second functional device 130 in the failing situation of the first functional device 110. In addition, when the through-silicon electrode 150 fails, the vehicle memory control apparatus 200 may be configured to block the connection with the through-silicon electrode in which a failure has occurred, and use another through-silicon electrode as a reading or writing path.

Figure 2:
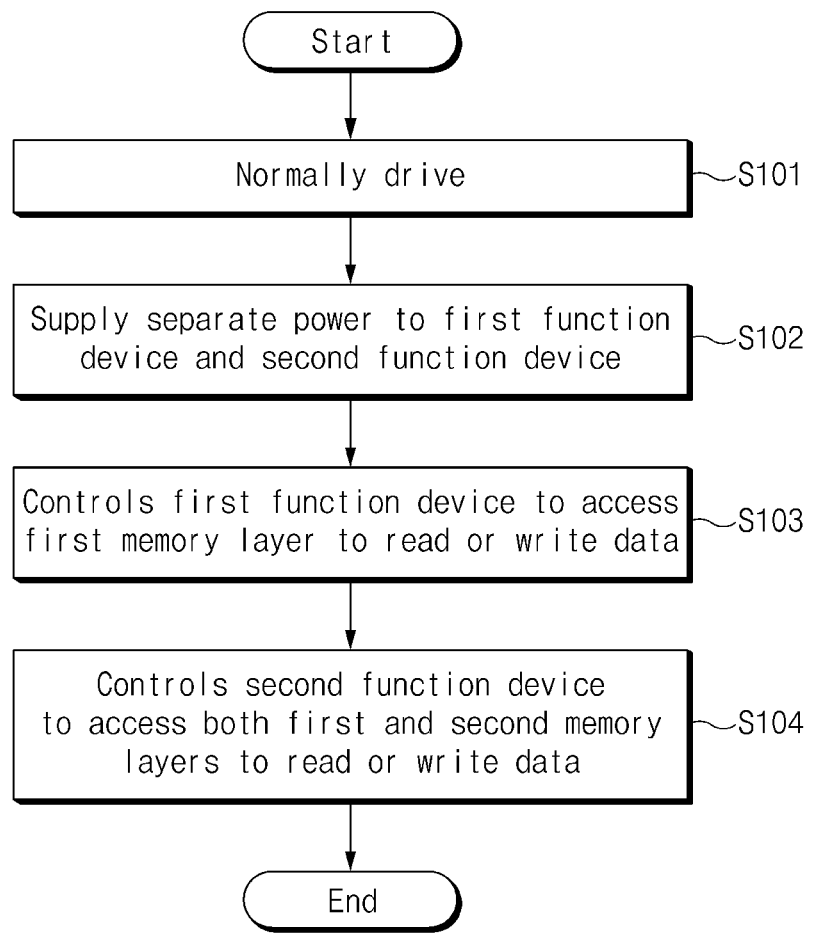
FIG. 2 illustrates a flowchart showing a driving method of a vehicle memory apparatus in a normal situation according to an exemplary embodiment of the present disclosure.
Figure 3:
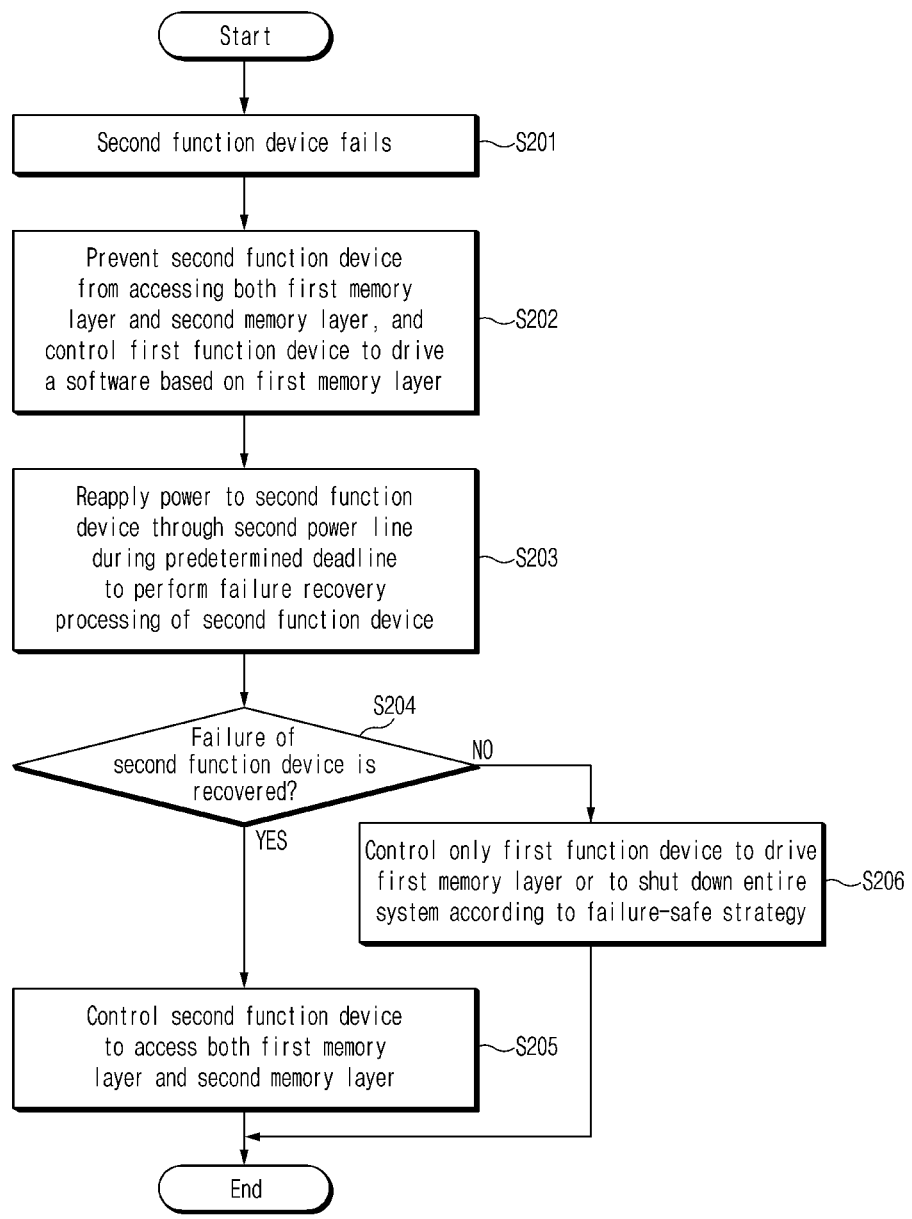
FIG. 3 illustrates a flowchart showing a driving method of a vehicle memory apparatus in an accelerator failure situation according to an exemplary embodiment of the present disclosure.
Figure 4:
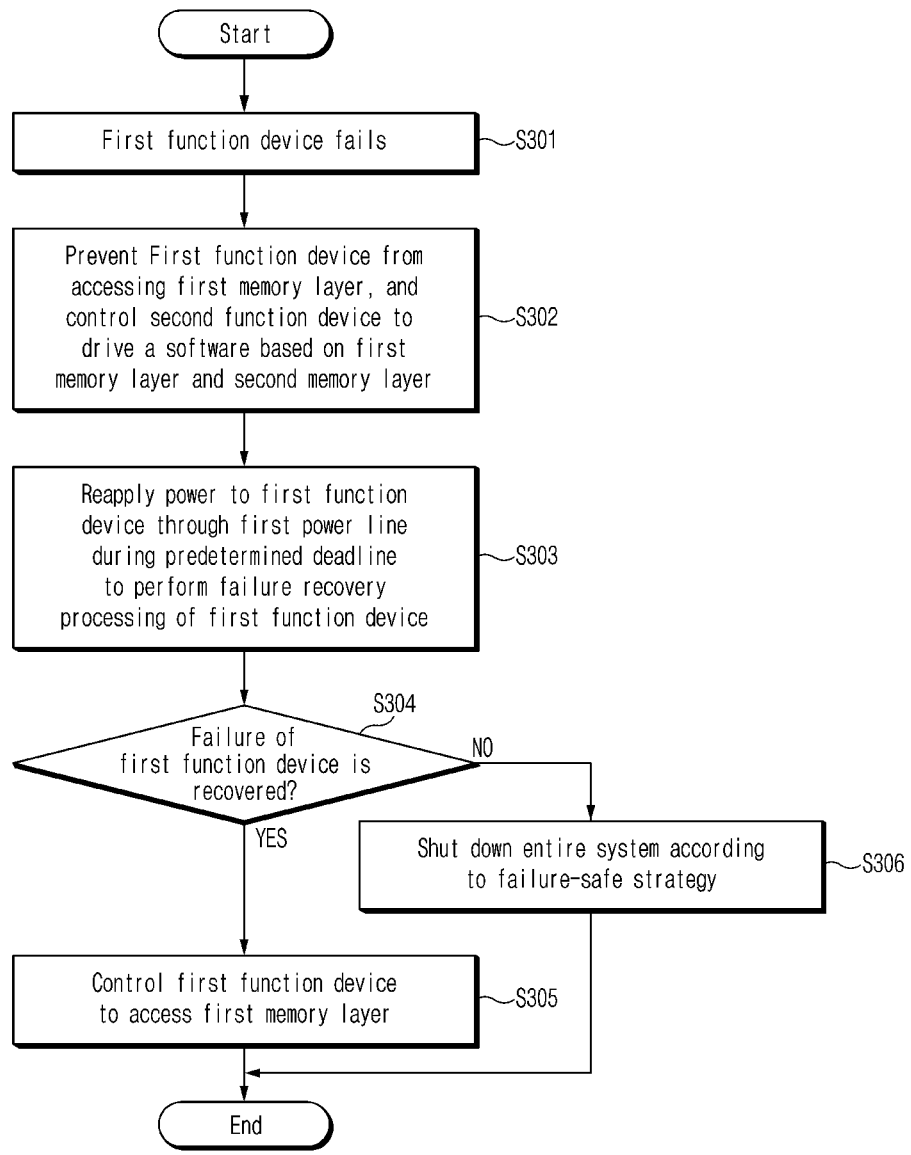
FIG. 4 illustrates a flowchart showing a driving method of a vehicle memory apparatus in a controller failure situation according to an exemplary embodiment of the present disclosure.

Hereinafter, a driving method of a vehicle memory apparatus according to an exemplary embodiment of the present disclosure will be described in detail with reference to FIG. 2 to FIG. 4. FIG. 2 illustrates a flowchart showing a memory driving method of a vehicle memory apparatus in a normal situation according to an exemplary embodiment of the present disclosure, and FIG. 3 illustrates a flowchart showing a memory driving method of a vehicle memory apparatus in an accelerator failure situation according to an exemplary embodiment of the present disclosure. FIG. 4 illustrates a flowchart showing a memory driving method of a vehicle memory apparatus in a controller failure situation according to an exemplary embodiment of the present disclosure.

Hereinafter, it is assumed that the vehicle memory control apparatus 200 of FIG. 1 performs the processes of FIG. 2 to FIG. 4. Referring to FIG. 2, when normally operated (S101), the vehicle memory control apparatus 200 may be configured to supply separate power to each of the second function device 130 and the first function device 110 to drive the second function device 130 and the first function device 110 (S102). Accordingly, the vehicle memory control apparatus 200 may be configured to operate the first function device 110 to access the first memory layer 120 to read or write data (S103), and operate the second function device 130 to access both the first and second memory layers 120 and 140 to read or write data (S104).

Referring to FIG. 3, when a failure occurs in the second function unit 130 (S201), the vehicle memory control apparatus 200 may be configured to prevent the second function device 130 from accessing both the first memory layer 120 and the second memory layer 140, and operate the first function device 110 to drive a software based on the first memory layer 120 (S202). Subsequently, the vehicle memory control apparatus 200 may be configured to reapply power to the second function device 130 in which a failure has occurred through a second power line during a predetermined deadline to perform failure recovery processing of the second function device 130 (S203).

The vehicle memory control apparatus 200 may be configured to determine whether a failure of the second function device 130 is recovered (S204), and in response to determining that the failure recovery of the second function device 130 is completed, operate the second function device 130 to access both the first memory layer 120 and the second memory layer 140 (S205). On the other hand, when failure recovery of the second function unit 130 fails, the vehicle memory control apparatus 200 may be configured to prevent the second function device 130 from accessing both the first memory layer 120 and the second memory layer 140, and operate only the first function device 110 to drive the first memory layer 120 or to shut down the entire system according to a failure-safe strategy (S206).

Referring to FIG. 4, when a failure occurs in the first function device 110 (S301), the vehicle memory control apparatus 200 may be configured to prevent the first function device 110 from accessing the first memory layer 120, and operate the second function device 130 to drive a software based on the first memory layer 120 and the second memory layer 140 (S302). Subsequently, the vehicle memory control apparatus 200 may be configured to reapply power to the first function device 110 through a first power line during a predetermined deadline to perform failure recovery processing of the first function device 110 (S303).

The vehicle memory control apparatus 200 may be configured to determine whether a failure of the first function device 110 is recovered (S304), and when the failure recovery of the first function device 110 is completed, operate the first function device 110 to access both the first memory layer 120 (S305). On the other hand, if the failure recovery of the first function unit 110 fails, the vehicle memory control apparatus 200 may be configured to shut down the entire system based on the fail-safe strategy (S306). Accordingly, according to the present disclosure, it is possible to secure stability of data processing by a vehicle controller by combining a 3D stacked memory, which is a next-generation memory technique, and a vehicle controller and an accelerator.

The above description is merely illustrative of the technical idea of the present disclosure, and those skilled in the art to which the present disclosure pertains may make various modifications and variations without departing from the essential characteristics of the present disclosure.

Therefore, the exemplary embodiments disclosed in the present disclosure are not intended to limit the technical ideas of the present disclosure, but to explain them, and the scope of the technical ideas of the present disclosure is not limited by these exemplary embodiments. The protection range of the present disclosure should be interpreted by the claims below, and all technical ideas within the equivalent range should be interpreted as being included in the scope of the present disclosure.

What is claimed is:

1. A vehicle memory system, comprising:
a first function device including a processor configured to perform a safety function of a vehicle related to vehicle movement safety;
a second function device including a processor configured to perform a convenience specification function related to general function of the vehicle;
a first memory cell layer that is shared by the first function device and the second function device;
a second memory cell layer that is used solely by the second function device; and
a vehicle memory device configured to have a stacked structure including a through-silicon electrode connecting each of the first function device, the first memory cell layer, the second function device, and the second memory cell layer;
wherein the st memory cell layer includes:
a first sublayer configured to enable reading and writ the first function device and reading access by the second function device; and
a second sublayer configured to enable reading and writing access by the second function device and only reading access by the first function device, and
wherein the first sublayer and the second sublayer are stacked.

2. The vehicle memory system of claim 1, wherein the first function device, the first memory cell layer, the second function device, and the second memory cell layer are stacked sequentially.

3. The vehicle memory system of claim 2, wherein the through-silicon electrode includes a reading path and a writing path for, respectively, reading from or writing to the memory cell layers, wherein the reading path and the writing path are separate from one another.

4. The vehicle memory system of claim 1, wherein the second memory cell layer includes
a first sublayer and a second sublayer;
wherein the first sublayer and the second sublayer are inaccessible by the first function device enable reading and writing access by the second function device, and are stacked on top of each other.

5. The vehicle memory system of claim 1, further comprising:
a vehicle memory control apparatus configured to monitor whether at least one of the first function device, the second function device, or the through-silicon electrode fails.

6. The vehicle memory system of claim 5, wherein the vehicle memory control apparatus, in response to determining that the first function device fails, is configured to:
operate the first function device to not access the first memory cell layer, and
perform recovery processing of the first function device by reapplying power to the first function unit.

7. The vehicle memory system of claim 6, wherein the vehicle memory control apparatus is configured to shut down the entire system when the recovery processing of the first function device fails.

8. The vehicle memory system of claim 5, wherein the vehicle memory control apparatus, in response to determining that the second function device fails, is configured to:
operate the second function device to not access the first memory cell layer and the second memory cell layer, and
perform recovery processing of the second function device by reapplying power to the second function unit.

9. The vehicle memory system of claim 8, wherein the vehicle memory control apparatus is configured to, when the recovery processing of the second function device fails:
operate only the first function device, or
shut down the entire system.

10. The vehicle memory system of claim 5, further comprising a plurality of through-silicon electrodes connecting each of the first function device, the first memory cell layer, the second function device, and the second memory cell layer;
wherein the vehicle memory control apparatus, in response to determining that a first through-silicon electrode of the plurality of through-silicon electrodes fails, is configured to:
block a reading path and a writing path of the first through-silicon electrode in which the failure has occurred, and
control a reading path and a writing path of a second through-silicon electrode of the plurality of through-silicon electrodes to read from or write to, respectively, the memory cell layers.

11. The vehicle memory system of claim 5, wherein the vehicle memory control apparatus is configured to independently apply power to the first function device and the second function device.

* * * * *